(12) United States Patent
Shin et al.

(10) Patent No.: US 10,381,337 B2
(45) Date of Patent: Aug. 13, 2019

(54) CAPACITOR

(71) Applicant: SAMSUNG ELECTRO-MECHANICS CO., LTD., Suwon-si, Gyeonggi-do (KR)

(72) Inventors: Hyun Ho Shin, Suwon-si (KR); Woong Do Jung, Suwon-si (KR); Jong Suk Han, Suwon-si (KR); Dong Sik Yoo, Suwon-si (KR); Jeong Hoon Ryou, Suwon-si (KR); No Il Park, Suwon-si (KR); Seung Mo Lim, Suwon-si (KR); Il Ro Lee, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/830,810

(22) Filed: Dec. 4, 2017

(65) Prior Publication Data
US 2018/0350790 A1 Dec. 6, 2018

(30) Foreign Application Priority Data
Jun. 1, 2017 (KR) ........................ 10-2017-0068466

(51) Int. Cl.
*H01L 27/01* (2006.01)
*H01L 23/00* (2006.01)
(Continued)

(52) U.S. Cl.
CPC ............ *H01L 27/016* (2013.01); *H01L 28/87* (2013.01); *H01L 28/91* (2013.01); *H05K 1/0231* (2013.01);
(Continued)

(58) Field of Classification Search
CPC ....... H01L 27/016; H01L 24/16; H01L 28/91; H01L 28/92
(Continued)

(56) References Cited

U.S. PATENT DOCUMENTS 6,437,385 B1  8/2002 Bertin et al.
7,193,262 B2  3/2007 Ho et al.
(Continued)

FOREIGN PATENT DOCUMENTS

EP       1359607 A2    11/2003

*Primary Examiner* — Eric W Thomas
*Assistant Examiner* — Arun Ramaswamy
(74) *Attorney, Agent, or Firm* — Morgan Lewis & Bockius LLP (57) ABSTRACT

A capacitor includes a plurality of cells each including a capacitance formation portion in which a plurality of trenches are positioned and a margin portion disposed around the capacitance formation portion. The cell includes three or more dielectric layers disposed in the capacitance formation portion and extending in the trenches, and three or more electrode layers sequentially stacked with dielectric layers interposed therebetween and extending in the trenches. At least first and second electrode layers have opposite polarities and each include a lead electrode extending from the capacitance formation portion to the margin portion. A lead electrode of the first electrode layer is disposed in a first region disposed to one side of a central portion of a cell, and a lead electrode of the second electrode layer is disposed in a second region disposed on another side of a central portion of the cell.

19 Claims, 11 Drawing Sheets

(51) Int. Cl.
*H01L 49/02* (2006.01)
*H05K 1/02* (2006.01)
*H01L 21/02* (2006.01)
*H01L 21/285* (2006.01)

(52) U.S. Cl.
CPC ........ *H01L 21/022* (2013.01); *H01L 21/0228* (2013.01); *H01L 21/02178* (2013.01); *H01L 21/02181* (2013.01); *H01L 21/02189* (2013.01); *H01L 21/28556* (2013.01); *H01L 24/16* (2013.01); *H01L 2224/16225* (2013.01); *H01L 2924/00014* (2013.01); *H01L 2924/15311* (2013.01); *H01L 2924/19011* (2013.01); *H01L 2924/19041* (2013.01); *H01L 2924/19106* (2013.01)

(58) Field of Classification Search
USPC ............ 361/321.1, 301.4, 306.1, 306.3, 303; 257/243, 532, 534
See application file for complete search history.

(56) References Cited

U.S. PATENT DOCUMENTS

| | | |
|---|---|---|
| 7,312,131 B2 | 12/2007 | Wu |
| 8,085,524 B2 | 12/2011 | Roozeboom et al. |
| 8,492,818 B2 | 7/2013 | Wong et al. |
| 9,105,759 B2 | 8/2015 | Chou et al. |
| 9,178,080 B2 | 11/2015 | Kalnitsky et al. |
| 9,209,190 B2 | 12/2015 | Chen et al. |
| 9,362,271 B2 | 6/2016 | Chou et al. |
| 2013/0161792 A1* | 6/2013 | Tran ...................... H01L 29/92 257/534 |
| 2015/0145103 A1 | 5/2015 | Chou et al. |
| 2016/0020267 A1 | 1/2016 | Lin |

* cited by examiner

CAPACITOR

CROSS-REFERENCE TO RELATED APPLICATION(S)

This application claims benefit of priority to Korean Patent Application No. 10-2017-0068466 filed on Jun. 1, 2017 in the Korean Intellectual Property Office, the disclosure of which is incorporated herein by reference in its entirety.

BACKGROUND

1. Field

The present disclosure relates to a capacitor having a trench.

2. Description of Related Art

Portable information technology (IT) products such as smartphones, wearable devices, and the like, are being developed to have increasingly thin cross-sections. As part of these developments, the passive elements present in the portable IT products are themselves being thinned in order to decrease the thickness of an overall package.

To this end, demand for thin-film ceramic capacitors allowing for a thinner thickness, as compared to a multilayer ceramic capacitor, has also increased.

The thin-film capacitors have an advantage in that a thin capacitor may be implemented by using a thin film technology. Further, since the thin-film capacitors have an advantage in that they have low equivalent series inductance (ESL) (unlike multilayer ceramic capacitors produced according to the related art), recently, the application of thin-film capacitors as decoupling capacitors has been considered.

In order to use a thin-film capacitor as a decoupling capacitor for an application processor (AP), a thin-film capacitor has been manufactured to have a form of a land-side capacitor (LSC). However, in a case of an existing embedded-type capacitor, it is impossible to rework a capacitor in the case of a capacitor defect, such that total loss cost is significantly increased. Therefore, there is a need to implement a thin-film ceramic capacitor in a form of a reworkable land-side capacitor (LSC).

Meanwhile, since a LSC type thin-film capacitor is disposed between solder balls, a thin-film capacitor should be designed to have a size as small as possible to significantly decrease a solder ball removal area.

At the same time, in order to increase capacitance of a thin-film capacitor, research has been conducted into a technology for applying a trench type structure capable of increasing a surface area, so as to contribute to implementing capacitance to the thin-film capacitor.

SUMMARY

An aspect of the present disclosure may provide a capacitor having a structure capable of significantly increasing capacitance of the capacitor by including three or more dielectric layers and trenches, and capable of significantly decreasing the number of connection electrode layers.

According to an aspect of the present disclosure, a capacitor may include a plurality of cells each including a capacitance formation portion in which a plurality of trenches are positioned and a margin portion disposed around the capacitance formation portion, the plurality of trenches being disposed in a substrate. Each cell includes three or more dielectric layers disposed in the capacitance formation portion and extending in the trenches, and three or more electrode layers disposed in the capacitance formation portion, sequentially stacked with respective dielectric layers of the three or more dielectric layers interposed therebetween, and extending in the trenches. First and second electrode layers of the three of more electrode layers of each cell have opposite polarities and each include a lead electrode extending from the capacitance formation portion to the margin portion. Based on a central portion of each respective cell in a first direction, one portion of the respective cell extending from the central portion in the first direction is a first region, and another portion of the respective cell extending from the central portion in a direction opposite to the first direction is a second region. The lead electrode of the first electrode layer is disposed in the first region, and the lead electrode of the second electrode layer is disposed in the second region.

According to another aspect of the present disclosure, a capacitor may include a plurality of cells each including a capacitance formation portion in which a plurality of trenches are positioned and a margin portion disposed around the capacitance formation portion, the plurality of trenches being disposed in a substrate. Each of the cells includes three or more dielectric layers disposed in the capacitance formation portion and extending in the trenches, and three or more electrode layers sequentially stacked with respective dielectric layers of the three or more dielectric layers interposed therebetween and assigned alternating first and second polarities in a stacking direction. At least two of the three or more electrode layers include lead electrodes extending from the capacitance formation portion to the margin portion. Among the plurality of cells, first and second cells are adjacent to each other, a region extending from a central portion of the first cell to a central portion of the second cell is a first region, and other regions of the first and second cells are a second region. The lead electrode of an electrode layer of the first polarity among the electrode layers included in the first and second cells is disposed in the first region, and the lead electrode of an electrode layer of the second polarity among the electrode layers included in the first and second cells is disposed in the second region.

According to another aspect of the present disclosure, a capacitor may include a plurality of cells each including a capacitance formation portion in which a plurality of trenches are positioned and a margin portion disposed around the capacitance formation portion. Each cell includes a plurality of electrode layers stacked together with dielectric layers interposed therebetween, and the electrode and dielectric layers are disposed in the capacitance formation portion and extend into the plurality of trenches. The electrode layers of each cell have alternating first and second polarities in a stacking direction thereof. The electrode layers of each cell have lead electrodes extending from the electrode layer disposed in the capacitance formation portion to the margin portion. Lead electrodes of electrode layers of the first polarity of one cell extend from the electrode layer in a first direction, and lead electrodes of electrode layers of the second polarity of the one cell extend from the electrode layer in a second direction opposite to the first direction.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

X, Y, and Z directions illustrated in the accompanying drawings may refer to length, width, and thickness directions, respectively, or be sequentially represented by first, second, and third directions, respectively.

Figure 1:
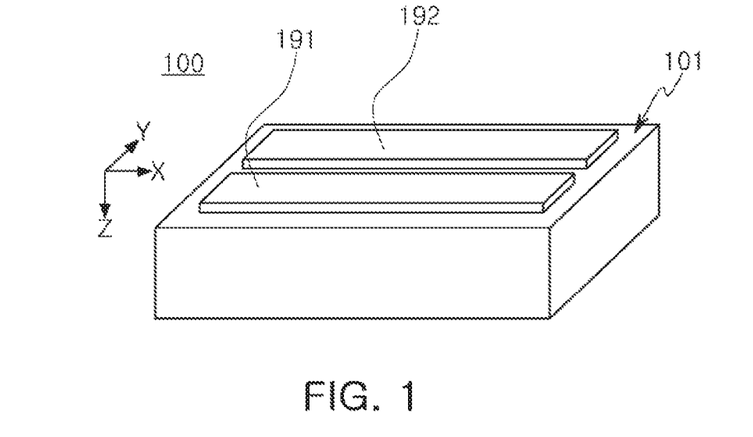
FIG. 1 is a schematic perspective view illustrating a capacitor according to an exemplary embodiment.
Figure 2:
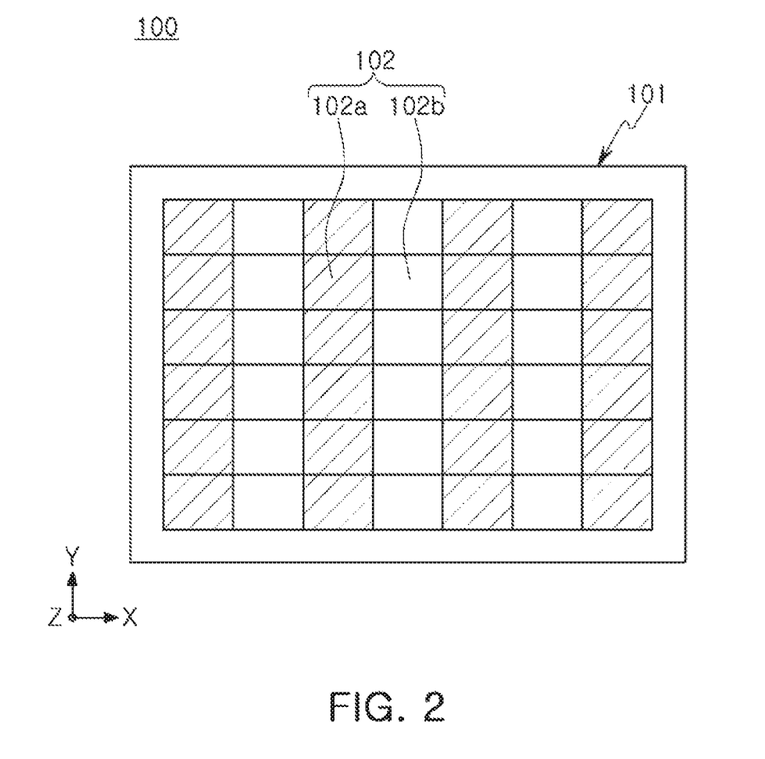
FIG. 2 is a schematic plan view illustrating the capacitor according to the exemplary embodiment.
Figure 3:
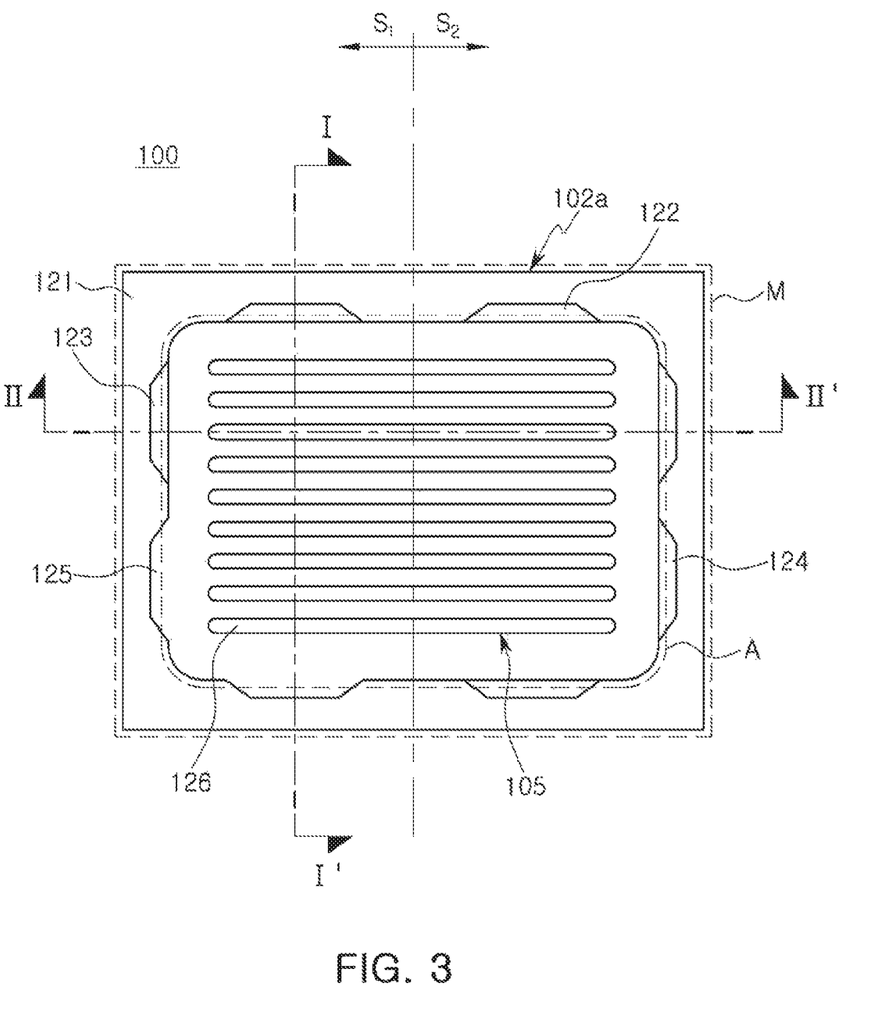
FIG. 3 is a schematic enlarged plan view illustrating one cell in the plan view of FIG. 2.
Figure 4:
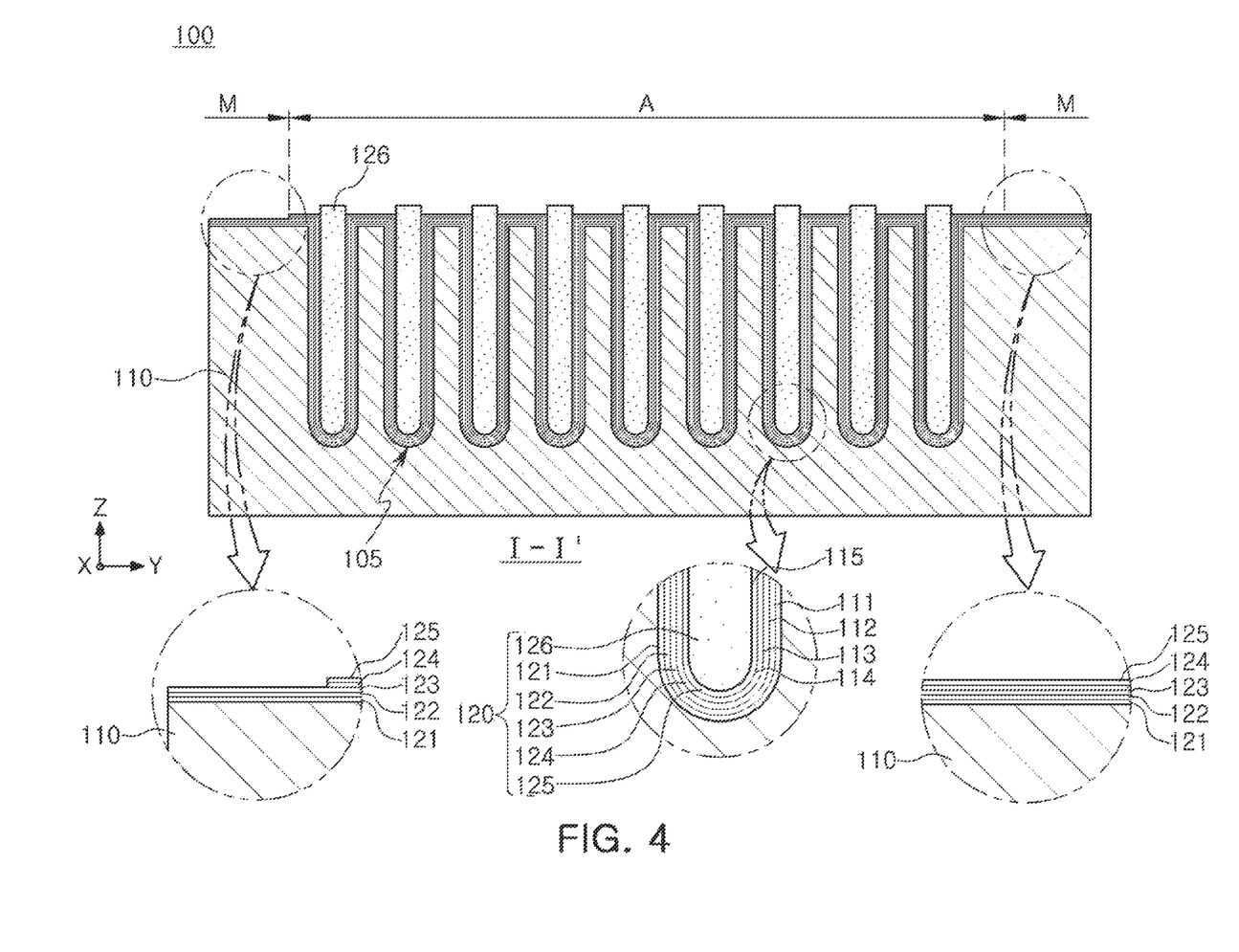
FIG. 4 is a schematic cross-sectional view taken along line I-I' of FIG. 3.
Figure 5:
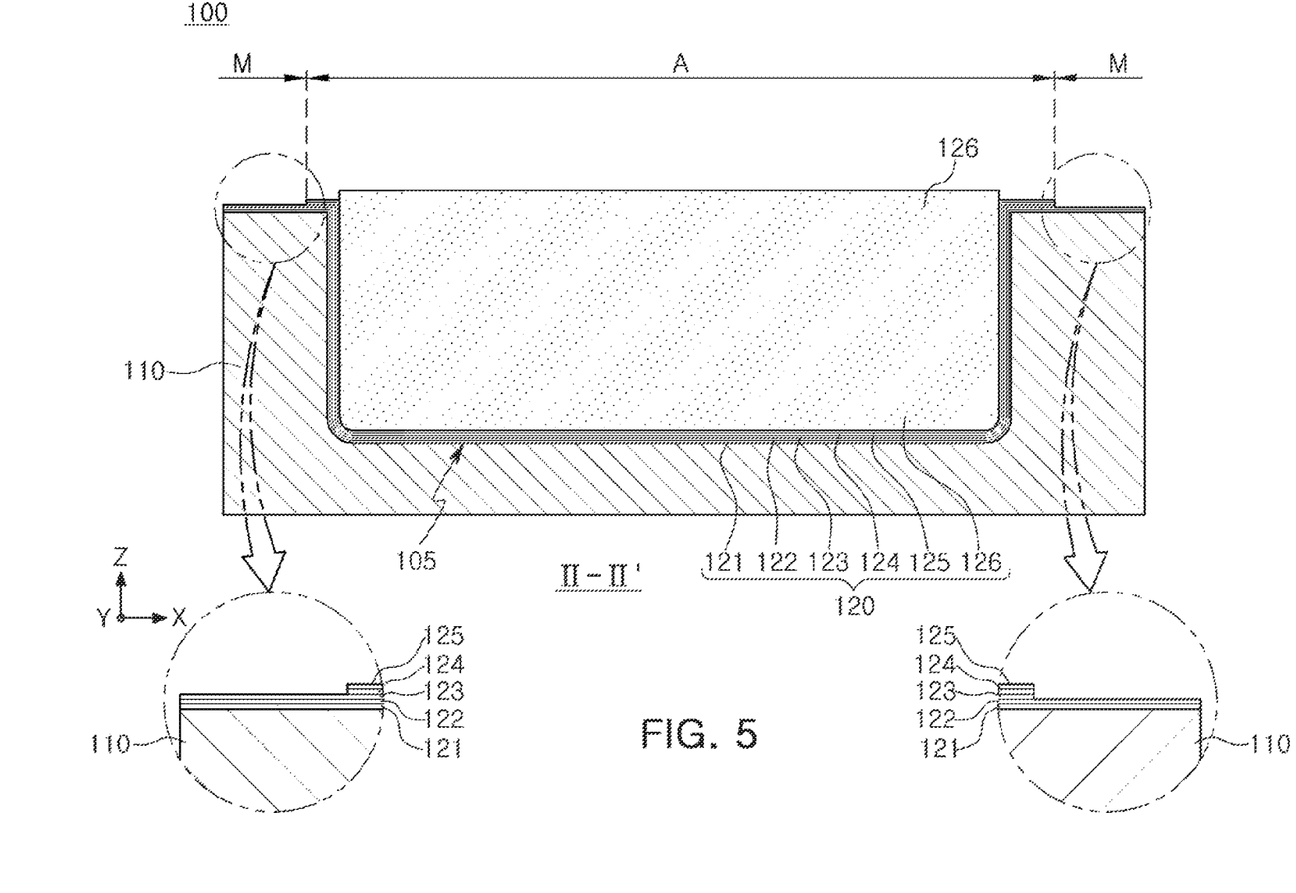
FIG. 5 is a schematic cross-sectional view taken along line II-II' of FIG. 3.

FIG. 1 is a schematic perspective view illustrating a capacitor according to an exemplary embodiment, and FIG. 2 is a schematic plan view illustrating a capacitor according to an exemplary embodiment. FIG. 3 is a schematic enlarged plan view illustrating one cell in the plan view of FIG. 2, FIG. 4 is a schematic cross-sectional view taken along line I-I' of FIG. 3, and FIG. 5 is a schematic cross-sectional view taken along line II-II' of FIG. 3.

Hereinafter, a capacitor 100 according to the exemplary embodiment in the present disclosure will be described with reference to FIGS. 1 through 5.

The capacitor 100 according to the exemplary embodiment may include a body 101 and first and second external electrodes 191 and 192 disposed on an outer surface of the body.

A shape of the body 101 is not particularly limited, but generally may be a hexahedral shape. Further, the body 101 is not particularly limited in view of dimensions, but may have, for example, a size of 0.6 mm×0.3 mm and may be a highly stacked and high-capacitance thin-film capacitor of 1.0 µF or more.

The body 101 may include a substrate 110. The substrate 110 may be formed of any one selected from the group consisting of Si, $SiO_2$, $Al_2O_3$, MgO, $LaAlO_3$, and $SrTiO_3$, or a combination thereof. For example, as the substrate 110, a silicon wafer may be used.

The substrate 110 may include a capacitance formation portion A and a margin portion M disposed around the capacitance formation portion A on one surface of the substrate 110. The capacitance formation portion A and the margin portion M may configure or form part of a single (e.g., same) cell 102. The capacitor 100 according to the exemplary embodiment may include a plurality of cells 102. Among the cells 102, a pair of cells 102 adjacent to each other may be defined as first and second cells 102a and 102b.

A plurality of trenches 105 penetrating from one surface of the substrate 110 to an interior of the substrate 110 may be disposed in the substrate 110. For example, the plurality of trenches 105 may be disposed in the capacitance formation portion A.

The trenches 105 may be formed by etching one surface of the substrate 110.

The trenches 105 may be formed to be elongated in the first (X) direction or the second (Y) direction perpendicular to the first (X) direction, and/or be regularly formed at a predetermined interval in the first (X) direction or the second (Y) direction. However, in the present disclosure, a description will be provided on the basis on an illustrative case in which the trenches 105 are formed to be elongated in the first (X) direction and to be regularly formed at a predetermined interval in the second (Y) direction.

Electrode layers 120 alternately disposed with respective dielectric layers interposed therebetween may be provided on one surface of the substrate 110 and in the trenches 105.

The capacitor 100 according to the exemplary embodiment may include at least n dielectric layers 111 to 115 (here, n≥3). When the number of dielectric layers included in the capacitor 100 is n, the number of electrode layers included in the capacitor 100 may be n or more, and may preferably be n+1. For example, referring to FIG. 4, in a case in which the number of dielectric layers is 5, a first electrode layer 121, a first dielectric layer 111, a second electrode layer 122, a second dielectric layer 112, a third electrode layer 123, a third dielectric layer 113, a fourth electrode layer 124, a fourth dielectric layer 114, a fifth electrode layer 125, a fifth dielectric layer 115, and a sixth electrode layer 126 may be sequentially stacked on one surface of the substrate 110 and of the trenches 105.

The electrode layers 120 may be formed using a conductive material. A material of the electrode layers 120 may be determined depending on a material of the dielectric layers 111 to 115. In a case in which the dielectric layers 111 to 115 are formed of a paraelectric material such as a metal oxide, or the like, the material of the electrode layers 120 may include a metal nitride. For example, the electrode layers 120 may be formed of TiN, but are not limited thereto.

The electrode layers 120 may be formed using an atomic layer deposition (ALD) method or an atomic vapor deposition (AVD) method, but are not limited thereto. However, the first electrode layer 121 disposed at a lowermost portion (e.g., disposed closest to the substrate 110 relative to the other electrode layers 122-126) may be a layer of impurities, formed by injecting n-type or p-type impurities into a substrate 110 formed of silicon.

The dielectric layers 111 to 115 may be formed of a paraelectric material such as a metal oxide, or the like. The dielectric layers 111 to 115 may contain any one of the metal oxides such as $Al_2O_3$, $ZrO_2$, $HfO_2$, and the like, or a combination thereof. The dielectric layers 111 to 115 may contain and be formed of the metal oxide such as $Al_2O_3$, $ZrO_2$, $HfO_2$, or the like, as a single material. Alternatively, the dielectric layers 111 to 115 may also be formed of composite layers in order to improve electrical leakage properties. In a case in which the dielectric layers 111 to 115 are formed of composite layers, the dielectric layers 111 to 115 may be $ZrO_2$—$Al_2O_3$—$ZrO_2$ composite layers.

The dielectric layers 111 to 115 may be formed using an atomic layer deposition (ALD) method or an atomic vapor deposition (AVD) method, but are not limited thereto.

Each pair of adjacent electrode layers 120 may be disposed to face each other with at least one dielectric layer 111, 112, 113, 114, or 115 interposed therebetween, such that the capacitor 100 may operate when voltages having different polarities are applied between odd-numbered electrode layers 121, 123, and 125, on the one hand, and even-numbered electrode layers 122, 124, and 126, on the other hand.

Therefore, the odd-numbered electrode layers 121, 123, and 125 and the even-numbered electrode layers 122, 124, and 126 may be alternately disposed with the dielectric layer 111, 112, 113, 114, or 115 interposed therebetween in the capacitance formation portion A, thereby providing a metal-insulator-metal (MIM) structure.

An insulating layer 181 (see, e.g., FIG. 12) may be disposed on the MIM structure to cover the dielectric layers 111 to 115 and the electrode layers 120. The insulating layer 181 may be formed of the silicon oxide ($SiO_2$), but is not limited thereto.

Unlike a multilayer ceramic capacitor, in a capacitor using a trench, when the number of electrode layers is increased, a separate connection electrode layer for connecting each of the electrode layers to an external electrode having a positive (+) or negative (−) polarity is generally used. Particularly, in a trench type capacitor according to the related art, in a case in which three or more dielectric layers are included, two or more connection electrode layers are used to connect an external electrode and each of the electrode layers to each other. The plurality of connection electrode layers as described above may cause an increase in thickness of the trench type capacitor.

However, since in the capacitor 100 according to the exemplary embodiment at least some of the electrode layers 120 include lead electrodes led out from the capacitance formation portion A to the margin portion M, each of the electrode layers 120 may be connected to the external electrode having a positive (+) or negative (−) polarity only by a single connection electrode layer.

For example, referring to FIGS. 6A through 6D, each of the second to fifth electrode layers 122 to 125 may include a lead electrode led out from the capacitance formation portion A to the margin portion M. The lead electrode may have a bookmark shape led out from the capacitance formation portion A to the margin portion M.

Referring to FIGS. 3 and 6A through 6D, the lead electrodes of the second to fifth electrode layers 122 to 125 may be disposed to be spaced apart from each other when viewed in the stacking direction. That is, the lead electrodes of the second to fifth electrode layers 122 to 125 may be disposed such that all of the lead electrodes are separately exposed on a plan view illustrated in a state in which the first insulating layer 181 is removed. In the capacitor 100 according to the exemplary embodiment, the lead electrodes of the second to fifth electrode layers 122 to 125 may be disposed to be spaced apart from each other when viewed in the stacking direction, such that all of the electrode layers may be connected to the external electrodes, respectively, by forming first and second connection electrode layers to be described below as single layers.

Further, referring to FIGS. 3 and 6A through 6D, based on a central portion of the cell 102, one portion of the cell 102 in the first direction may be defined as a first region $S_1$, and the other portion of the cell 102 in the first direction may be defined as a second region $S_2$. Here, among the second to fifth electrode layers 122 to 125, the lead electrodes of the odd numbered electrode layers stacked in odd numbered positions from the bottom in the stacking direction, that is, the lead electrodes of the third and fifth electrode layers 123 and 125 may be disposed in the first region $S_1$. Additionally, the lead electrodes of the even numbered electrode layers stacked in even numbered positions, that is, the lead electrodes of the second and fourth electrode layers 122 and 124 may be disposed in the second region $S_2$.

The first and sixth electrode layers 121 and 126 disposed in lowermost and uppermost portions in the stacking direction, respectively, may not include a lead electrode led out from the capacitance formation portion A to the margin portion M. The first electrode layer 121 may be disposed on the substrate 110 without a separate lead electrode, such that the first electrode layer 121 may be connected to the connection electrode layer by forming a via in a boundary of each of the cells 102, and the sixth electrode layer 126 may be connected to the connection electrode layer by forming a via on the trench 105 without a separate lead electrode.

Referring to FIGS. 3 and 6A through 6D, the second to fifth electrode layers 122 to 125 may include second to fifth capacitance electrodes 122a to 125a and second to fifth lead electrodes 122b to 125b, respectively.

The second lead electrode 122b of the second electrode layer 122 may be disposed in the second region $S_2$, the third lead electrode 123b of the third electrode layer 123 may be disposed in the first region $S_1$, the fourth lead electrode 124b of the fourth electrode layer 124 may be disposed in the second region $S_2$, and the fifth lead electrode 125b of the fifth electrode layer 125 may be disposed in the first region $S_1$.

Figure 6A:
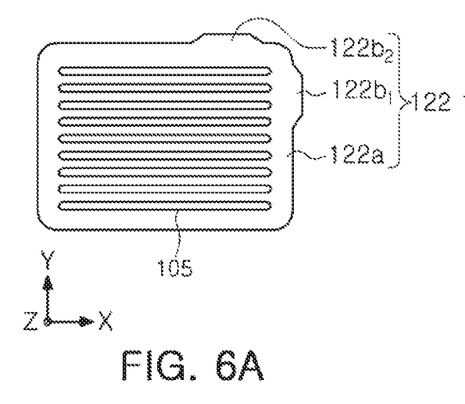
FIGS. 6A through 6D are schematic plan views illustrating second to fifth electrode layers.

The second lead electrode 122b may include a second lead electrode $122b_1$ led to the margin portion in the first (X) direction and a second lead electrode $122b_2$ led to the margin portion in the second (Y) direction. The second lead electrodes $122b_1$ and $122b_2$ may be disposed to be adjacent to each other in a corner of the capacitance formation portion A, that is, a corner of the second capacitance electrode 122a.

Figure 6B:
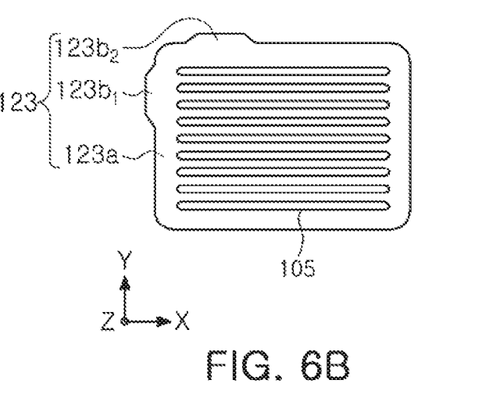

The third lead electrode 123b may include a third lead electrode $123b_1$ led to the margin portion in the first (X) direction and a third lead electrode $123b_2$ led to the margin portion in the second (Y) direction. The third lead electrodes $123b_1$ and $123b_2$ may be disposed to be adjacent to each other in a corner of the capacitance formation portion A, that is, a corner of the third capacitance electrode 123a.

Figure 6C:
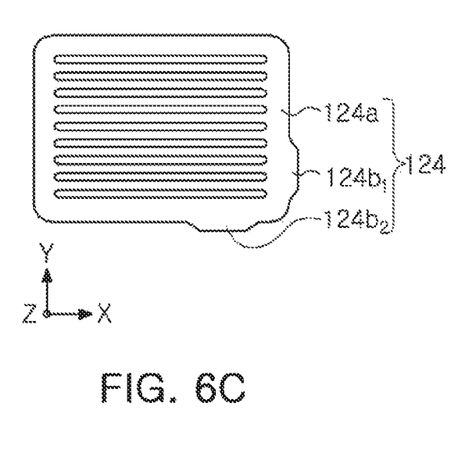

The fourth lead electrode 124b may include a fourth lead electrode $124b_1$ led to the margin portion in the first (X) direction and a fourth lead electrode $124b_2$ led to the margin portion in the second (Y) direction. The fourth lead electrodes $124b_1$ and $124b_2$ may be disposed to be adjacent to each other in a corner of the capacitance formation portion A, that is, a corner of the fourth capacitance electrode 124a.

Figure 6D:
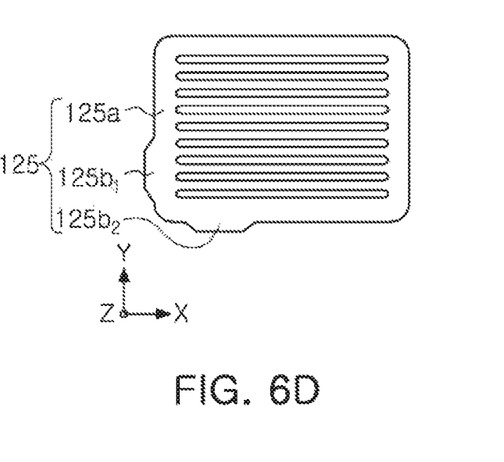

Further, the fifth lead electrode 125b may include a fifth lead electrode $125b_1$ led to the margin portion in the first (X) direction and a fifth lead electrode $125b_2$ led to the margin portion in the second (Y) direction. The fifth lead electrodes $125b_1$ and $125b_2$ may be disposed to be adjacent to each other in a corner of the capacitance formation portion A, that is, a corner of the fifth capacitance electrode 125a.

Here, lead electrodes included in a pair of electrode layers adjacently stacked among the electrode layers and led to the second (Y) direction may be disposed on the same side of the capacitance formation portion A as each other.

For example, the fourth lead electrode $124b_2$ and the fifth lead electrode $125b_2$ of the fourth and fifth electrode layers 124 and 125 adjacent to each other may be disposed on the same side of the capacitance formation portion A as each other.

The lead electrodes included in the pair of electrode layers adjacently stacked and led to the second (Y) direction may be disposed on the same side of the capacitance formation portion A as described above, such that equivalent series inductance (ESL) may be decreased due to cancellation of mutual inductance.

Figure 7A:
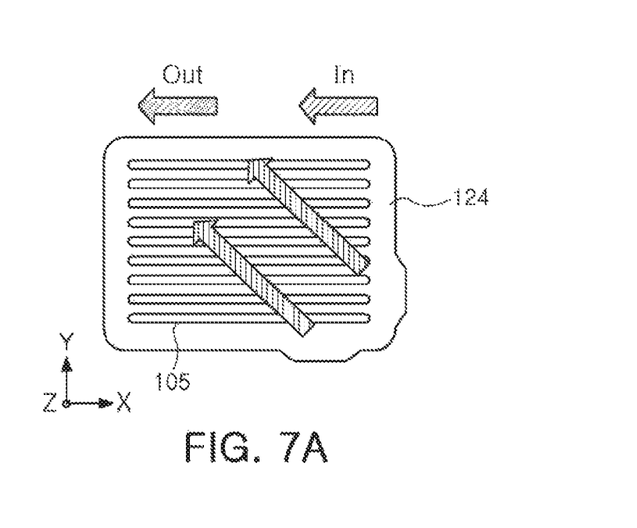
FIGS. 7A and 7B are schematic views illustrating current flows in fourth and fifth electrode layers.
Figure 7B:
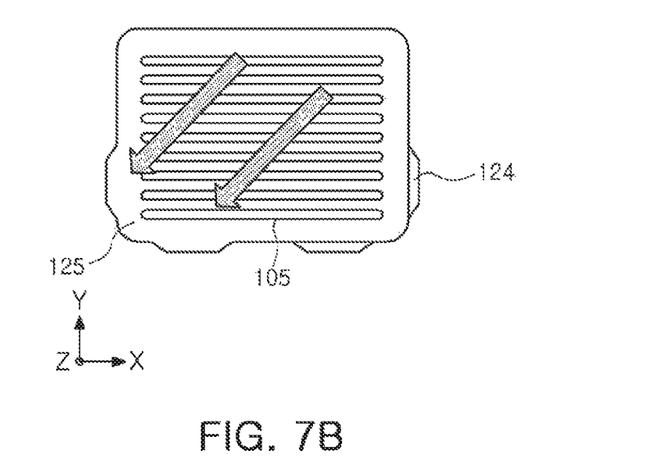

Referring to FIGS. 7A and 7B, the fourth electrode layer 124 may have a current flow in a left upward direction depending on a position of the fourth lead electrode 124b, and the fifth electrode layer 125 may have a current flow in a left downward direction depending on a position of the fifth lead electrode 125b. Therefore, main current flows formed by the fourth and fifth electrode layers 124 and 125 may have an angle of about 90 degrees, such that an increase in mutual inductance due to overlapping of mutual inductance may be prevented, and the mutual inductance may be canceled. In the capacitor according to the exemplary embodiment, the second and third electrode layers 122 and 123 and the fourth and fifth electrode layers 124 and 125 may correspond to electrode layers capable of decreasing ESL as described above.

Figure 8:
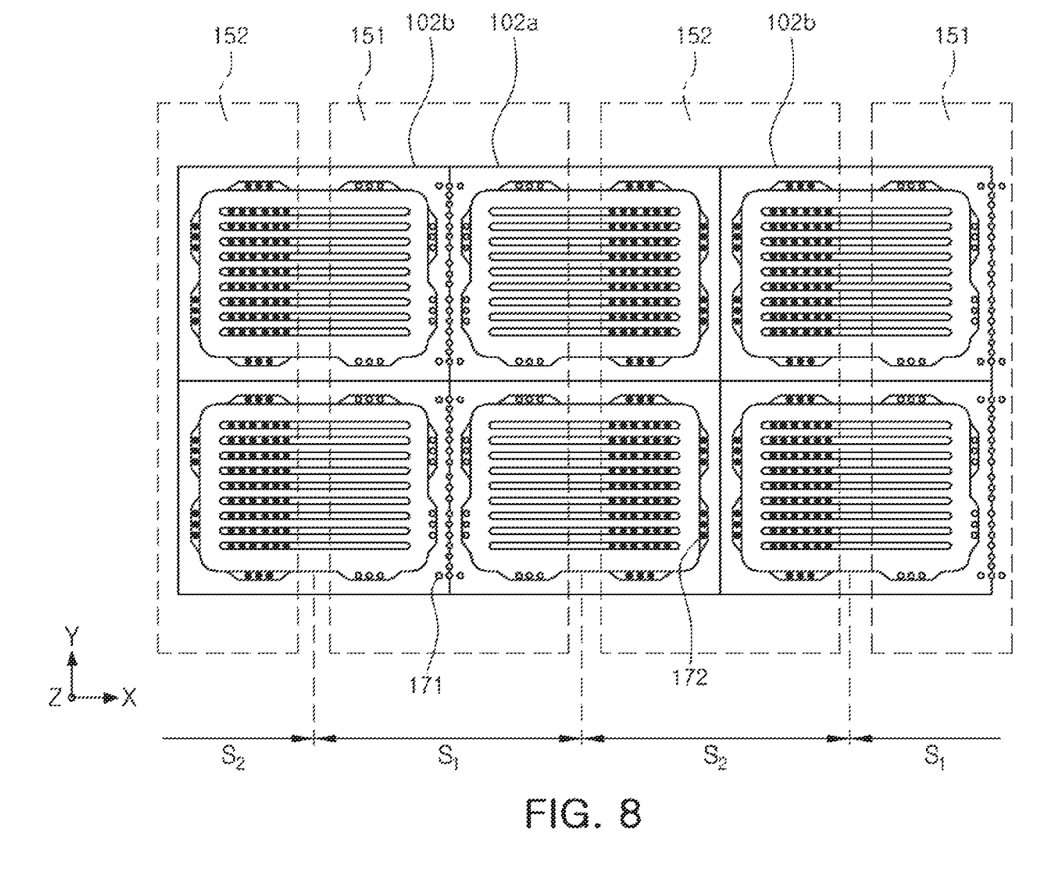
FIG. 8 is a schematic plan view illustrating first and second connection electrode layers formed on a plurality of cells in the capacitor according to the exemplary embodiment.

FIG. 8 is a schematic plan view illustrating first and second connection electrode layers 151 and 152 formed on a plurality of cells 102 in the capacitor according to the exemplary embodiment.

A positional relationship between each of the cells 102 and the connection electrode layers 151 and 152 will be described with reference to FIG. 8.

Among the plurality of cells 102, one of a pair of cells 102 adjacent to each other may be defined as a first cell 102a, and the other thereof may be defined as a second cell 102b. Further, based on a central portion of each of the first and second cells 102a and 102b, a region in which the first and second cells 102a and 102b come in contact with each other may be a first region $S_1$, and the other region may be a second region $S_2$.

That is, at the time of confirming the first and second regions $S_1$ and $S_2$ in the entirety of cells 102 after defining the first and second regions $S_1$ and $S_2$ based on the first and second cells 102a and 102b adjacent to each other, the first and second regions $S_1$ and $S_2$ may be alternately disposed as illustrated in FIG. 8.

In this case, the lead electrodes may be disposed so that the first and second cells 102a and 102b are line-symmetrical to each other based on the boundary between the first and second cells 102a and 102b. That is, the lead electrodes may be disposed so that the first and second cells 102a and 102b are line-symmetrical to each other based on the boundary between the first and second cells 102a and 102b, such that the odd numbered electrode layers 121, 123, and 125 included in the first and second cells 102a and 102b may be connected together to the first connection electrode layer 151 disposed in the first region $S_1$, and the even numbered electrode layers 122, 124, and 126 included in the first and second cells 102a and 102b may be connected together to the second connection electrode layer 152 disposed in the second region $S_2$.

Referring to FIG. 8, in the first region $S_1$, the first electrode layer 121 may be connected to the first connection electrode layer 151 by forming a first via 171 in the boundary between the first and second cells 102a and 102b in the margin portion M. Further, in the first region $S_1$, the third and fifth electrode layers 123 and 125 may also be connected to the first connection electrode layer 151 by forming the first via 171 at positions corresponding to the lead electrodes of the third and fifth electrode layers 123 and 125.

In the second region $S_2$, the second and fourth electrode layers 122 and 124 may be connected to the second connection electrode layer 152 by forming a second via 172 at positions corresponding to the lead electrodes of the second and fourth electrode layers 122 and 124. Further, the sixth electrode layers 126 may be connected to the second connection electrode layer 152 by forming the second via 172 at a position corresponding to an upper portion of the trench 105 in the second region $S_2$.

That is, the first connection electrode layer 151 may be disposed in the first region $S_1$, and the second connection electrode layer 152 may be spaced apart from the first connection electrode layer 151 by a predetermined distance and disposed in the second region $S_2$.

In order to decrease equivalent series inductance (ESL) of the capacitor 100, it is important to selectively dispose the connection electrode layers of the capacitor 100. That is, there is a need to dispose positive (+) and negative (−) polarity electrodes of electrode layers implementing capacitance in consideration of a flow of electricity. In contrast to the disposition detailed herein in relation to the capacitor 100, in the capacitor according to the related art in which connection electrode layers and respective electrode layers were connected to each other through vias, symmetry with respect to respective cells was low and thus appropriate positioning of the electrodes was not possible due to structural limitations of the trench type capacitor.

However, in the capacitor 100 according to the exemplary embodiment, the first and second connection electrode layers 151 and 152 may be formed to be elongated in one direction and alternately disposed as illustrated in FIG. 8, such that symmetry of the connection electrode layers 151 and 152 may be significantly increased and thus ESL may be significantly decreased.

At the same time, since in the capacitor 100 according to the exemplary embodiment at least some of the electrode layers include the lead electrodes having the bookmark shape led out from the capacitance formation portion A to the margin portion M, the first and second connection electrode layers 151 and 152 may be formed of a single layer. That is, the first and second connection electrode layers 151 and 152 may be formed of the single layer, such that the capacitor 100 may be thinned or capacitance of the capacitor 100 may be increased.

FIGS. 9 through 13 are schematic plan views and schematic cross-sectional views for explaining a structure in which first and second connection electrode layers and first and second external electrodes are connected to each other.

Figure 9:
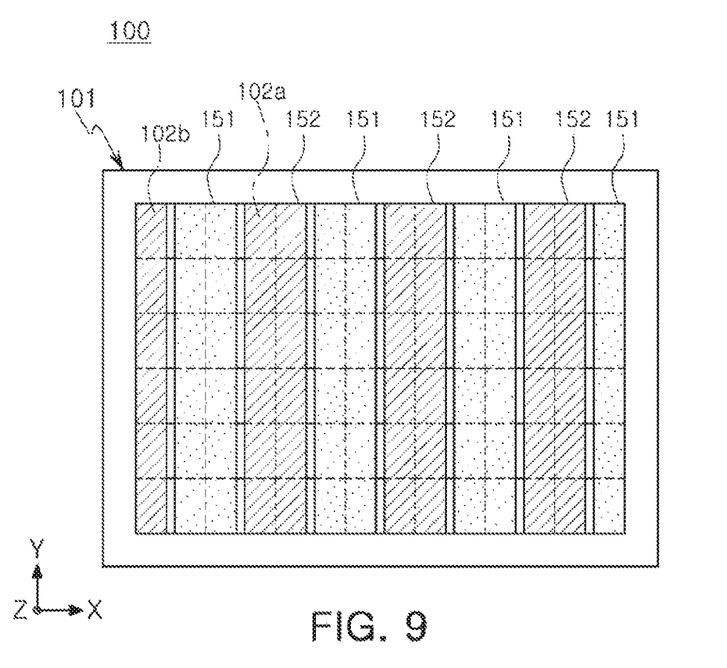
FIGS. 9 through 13 are schematic plan views and schematic cross-sectional views used for explaining a structure in which first and second connection electrode layers and first and second external electrodes are connected to each other.

Referring to FIG. 9, in the capacitor 100 according to the exemplary embodiment, the first and second cells 102a and 102b may be alternately disposed in one direction, and the first or second connection electrode layer 151 or 152 may be formed to cover the first and second cells 102a and 102b adjacent to each other.

Figure 10:
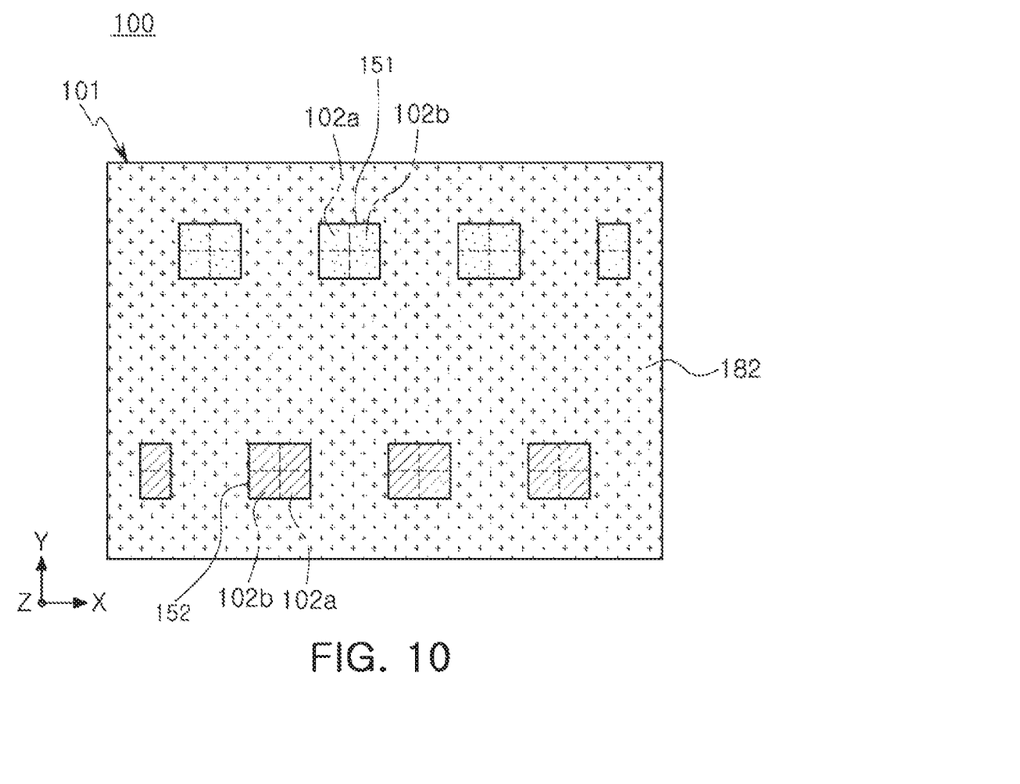

Next, as illustrated in FIG. 10, a second insulating layer 182 may be formed. The second insulating layer 182 may have openings exposing only the first connection electrode layer 151 on a single straight line, and have other openings exposing only the second connection electrode layer 152 on another straight line.

Figure 11:
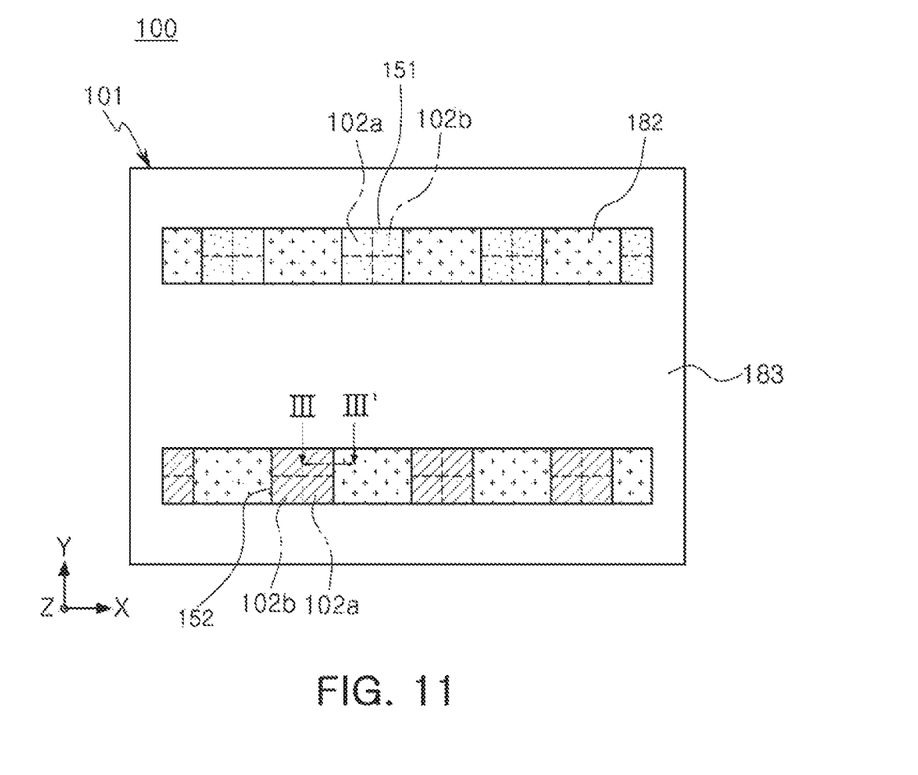

Next, as illustrated in FIG. 11, except for positions in which the first and second external electrodes will be formed, a third insulating layer 183 may be disposed in the other positions.

Figure 12:
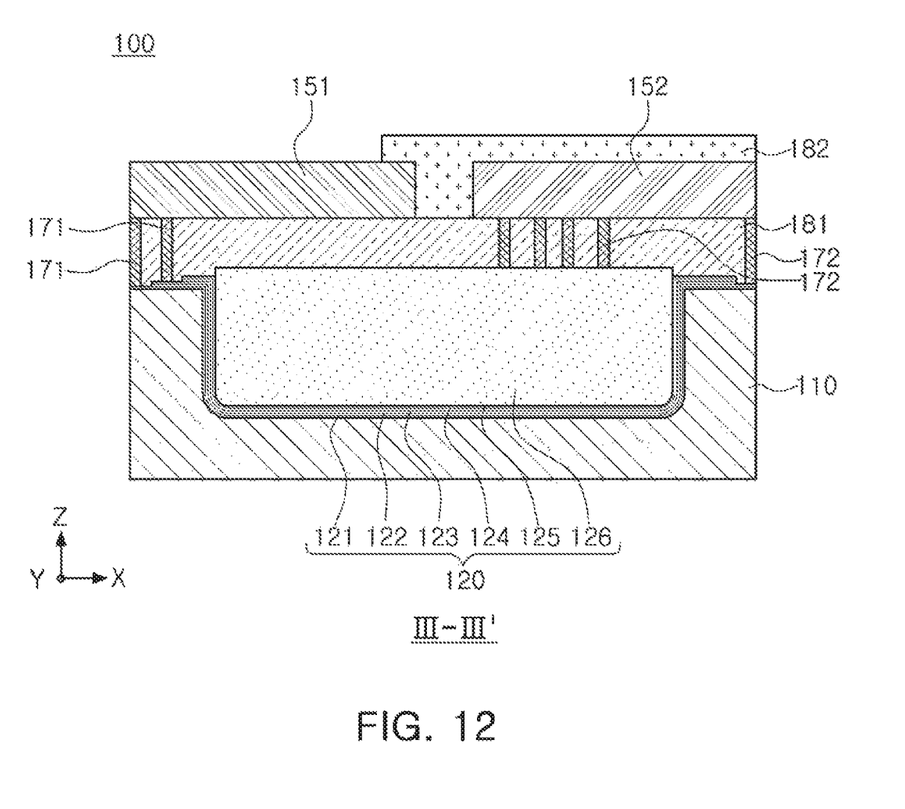

Referring to FIG. 12, it may be confirmed that the second insulating layer 182 is disposed between the first and second connection electrode layers 151 and 152. Further, as described above, it may be confirmed that the sixth electrode layer 126 is connected to the second connection electrode layer 152 through the second via 172 disposed on the trench 105, and the first electrode layer 121 is connected to the first connection electrode layer 151 through the first via 171 in the margin portion.

Figure 13:
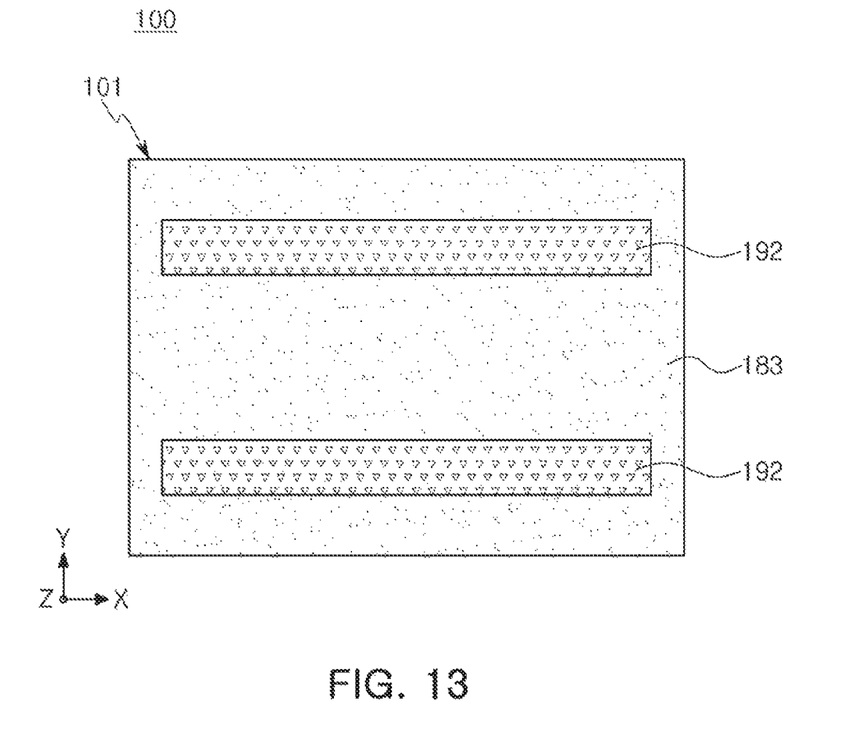

Finally, referring to FIG. 13, the first and second external electrodes 191 and 192 may be formed in the positions in which the first and second external electrodes will be formed on the third insulating layer 183.

Figure 14:
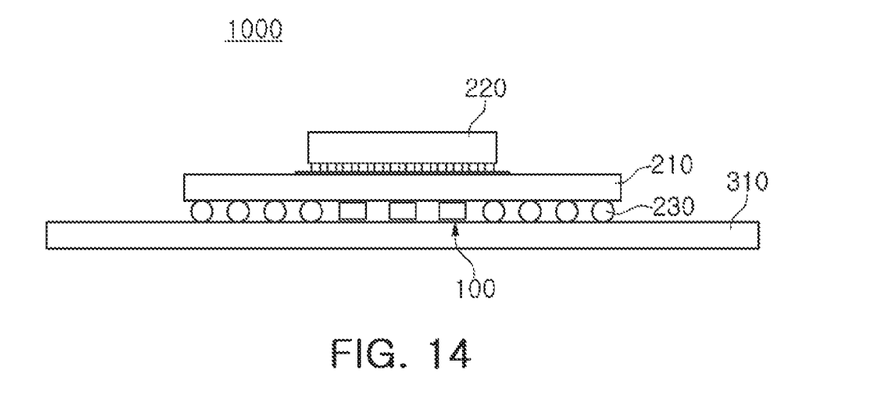
FIG. 14 is a schematic cross-sectional view illustrating a board having a capacitor according to another exemplary embodiment.

FIG. 14 is a schematic cross-sectional view illustrating a board having a capacitor according to another exemplary embodiment.

Referring to FIG. 14, a board 1000 having a capacitor according to another exemplary embodiment may include a circuit board 210, a semiconductor chip 220 disposed on one surface of the circuit board 210, and a capacitor 100 disposed on the other surface of the circuit board 210.

Here, as the capacitor 100, the capacitor 100 according to the exemplary embodiment may be used. The capacitor 100 according to the exemplary embodiment is a so-called thin-film capacitor. Since the thin-film capacitor has an advantage in that it has low equivalent series inductance (ESL) unlike a multilayer ceramic capacitor according to the related art, recently, application of the thin-film capacitor as a decoupling capacitor for an application processor (AP) has been considered. Particularly, in a case in which the capacitor is used as the decoupling capacitor, there is a need to dispose the capacitor to be adjacent to the AP. Therefore, in the board 1000 having a capacitor according to another exemplary embodiment, the semiconductor chip 220 used as the AP may be disposed on one surface of the circuit board 210, and the capacitor 100 may be disposed at a position opposite to the semiconductor chip 220 on the other surface of the circuit board 210.

The capacitor 100 disposed at the position opposite to the semiconductor chip 220 as described above is referred to as a land-side capacitor (LSC). Since the LSC type capacitor 100 as described above is disposed on the other surface of the circuit board 210 at the position opposite to the semiconductor chip 220, in order to mount the circuit board 210 on a main board 310, the capacitor generally needs to have a thickness thinner than that of solder balls 230, and there is a need to significantly decrease a solder ball removal area by designing the capacitor to be as small as possible.

That is, in the capacitor 100 according to the exemplary embodiment, the lead electrodes of the odd numbered electrode layers stacked in odd numbered positions among the electrode layers may be disposed in the first region $S_1$ and the lead electrodes of the even numbered electrode layers stacked in even numbered positions among the electrode layers may be disposed in the second region $S_2$, such that even though the capacitor includes three or more dielectric layers to implement high capacitance, the number of connection electrode layers connecting each of the electrode layers and the external electrodes may be significantly decreased, and thus, the capacitor 100 may be formed to be thinner than the solder ball.

As set forth above, in the capacitor according to the exemplary embodiment, the lead electrodes of the odd numbered electrode layers among the electrode layers may be disposed in the first region $S_1$ and the lead electrodes of the even numbered electrode layers among the electrode layers may be disposed in the second region $S_2$, such that even though the capacitor includes three or more dielectric layers to implement high capacitance, the number of connection electrode layers connecting each of the electrode layers and the external electrodes may be significantly decreased.

While exemplary embodiments have been shown and described above, it will be apparent to those skilled in the art that modifications and variations could be made without departing from the scope of the present invention as defined by the appended claims.

What is claimed is:

1. A capacitor comprising:
a plurality of cells each including a capacitance formation portion in which a plurality of trenches are positioned and a margin portion disposed around the capacitance formation portion, the plurality of trenches being disposed in a substrate,
wherein each cell includes:
three or more dielectric layers disposed in the capacitance formation portion and extending in the trenches; and
three or more electrode layers disposed in the capacitance formation portion, sequentially stacked with respective dielectric layers of the three or more dielectric layers interposed therebetween, and extending in the trenches,
first and second electrode layers of the three or more electrode layers of each cell have opposite polarities and each include a lead electrode extending from the capacitance formation portion to the margin portion,
based on a central portion of each respective cell in a first direction, one portion of the respective cell extending from the central portion in the first direction is a first region, and another portion of the respective cell extending from the central portion in a direction opposite to the first direction is a second region,
the lead electrode of the first electrode layer is disposed in the first region, and the lead electrode of the second electrode layer is disposed in the second region,
the lead electrode of the first electrode layer includes a first lead electrode extending from the capacitance formation portion in the first direction and a second lead electrode extending from the capacitance formation portion in a second direction perpendicular to the first direction,
the lead electrode of the second electrode layer includes a third lead electrode extending from the capacitance formation portion in the first direction and a fourth lead electrode extending from the capacitance formation portion in the second direction, and
the first and second lead electrodes are disposed to be adjacent to a same corner of the capacitance formation portion, and the third and fourth lead electrodes are disposed to be adjacent to a same other corner of the capacitance formation portion.

2. The capacitor of claim 1, wherein in each cell, a number of the electrode layers in the cell is one higher than a number of the dielectric layers in the cell.

3. The capacitor of claim 1, wherein the lead electrodes are disposed to be spaced apart from each other when viewed in a stacking direction of the electrode layers.

4. The capacitor of claim 1, wherein among the three or more electrode layers in each cell, electrode layers stacked in lowermost and uppermost positions do not include a lead electrode led out from the capacitance formation portion to the margin portion.

5. The capacitor of claim 1, wherein the second and fourth lead electrodes, included in a pair of electrode layers stacked adjacently to each other among the plurality of electrode layers, are disposed on a same side of the capacitance formation portion as each other.

6. The capacitor of claim 1, wherein among the three or more electrode layers in each cell, an electrode layer disposed closest to the substrate includes a layer of impurities injected into the substrate in which the plurality of trenches are disposed.

7. The capacitor of claim 1, further comprising:
a first connection electrode layer disposed in the first region; and
a second connection electrode layer disposed in the second region to be spaced apart from the first connection electrode layer.

8. The capacitor of claim 7, wherein the first connection electrode layer is connected to the first electrode layer by a first via, and
the second connection electrode layer is connected to the second electrode layer by a second via.

9. The capacitor of claim 7, wherein the first and second connection electrode layers are single layers disposed adjacently to each other in a plane orthogonal to a stacking direction of the three of more electrode layers.

10. A capacitor comprising:
a plurality of cells each including a capacitance formation portion in which a plurality of trenches are positioned and a margin portion disposed around the capacitance formation portion, the plurality of trenches being disposed in a substrate,
wherein each of the cells includes:
three or more dielectric layers disposed in the capacitance formation portion and extending in the trenches; and
three or more electrode layers sequentially stacked with respective dielectric layers of the three or more dielectric layers interposed therebetween and assigned alternating first and second polarities in a stacking direction,
at least two of the three or more electrode layers include lead electrodes extending from the capacitance formation portion to the margin portion,
among the plurality of cells, first and second cells are adjacent to each other, a region extending from a central portion of the first cell to a central portion of the second cell is a first region, and other regions of the first and second cells are a second region,
the lead electrode of an electrode layer of the first polarity among the electrode layers included in the first and second cells is disposed in the first region, and the lead electrode of an electrode layer of the second polarity among the electrode layers included in the first and second cells is disposed in the second region, and
the lead electrodes are disposed so that the first and second cells are line-symmetrical to each other based on a boundary line on which the first and second cells come in contact with each other.

11. The capacitor of claim 10, further comprising:
a first connection electrode layer disposed in the first region; and
a second connection electrode layer disposed in the second region to be spaced apart from the first connection electrode layer.

12. The capacitor of claim 11, wherein the first connection electrode layer is connected to the electrode layer of the first polarity by a first via, and
the second connection electrode layer is connected to the electrode layer of the second polarity by a second via.

13. The capacitor of claim 12, wherein the first and second connection electrode layers are single layers disposed adjacently to each other in a plane orthogonal to a stacking direction of the three of or more electrode layers.

14. A capacitor comprising:
a plurality of cells each including a capacitance formation portion in which a plurality of trenches are positioned and a margin portion disposed around the capacitance formation portion,
wherein each cell includes a plurality of electrode layers stacked together with dielectric layers interposed therebetween, the electrode and dielectric layers disposed in the capacitance formation portion and extending into the plurality of trenches,
the electrode layers of each cell have alternating first and second polarities in a stacking direction thereof,
the electrode layers of each cell have lead electrodes extending from the electrode layer disposed in the capacitance formation portion to the margin portion,
lead electrodes of electrode layers of the first polarity of one cell extend from the electrode layer in a first direction, and lead electrodes of electrode layers of the second polarity of the one cell extend from the electrode layer in a second direction opposite to the first direction, and
another cell is disposed adjacent to the one cell in the first direction, lead electrodes of electrode layers of the first polarity of the other cell extend from the electrode layer in the second direction, and lead electrodes of electrode layers of the second polarity of the other cell extend from the electrode layer in the first direction.

15. The capacitor of claim 14, further comprising:
a first metal interconnection layer extending over and electrically interconnecting the lead electrodes of electrode layers of the first polarity of the one cell and of the other cell adjacent to the one cell in the first direction; and
second metal interconnection layers extending over and electrically interconnecting the lead electrodes of electrode layers of the second polarity of the one cell and of the other cell adjacent to the one cell.

16. The capacitor of claim 15, wherein further cells are disposed adjacent to the one cell in a third direction orthogonal to the first direction,
the first metal interconnection layer further extends over and electrically interconnects the lead electrodes of electrode layers of the first polarity of the further cells, and
the second metal interconnection layers further extend over and electrically interconnect the lead electrodes of electrode layers of the second polarity of the further cells.

17. The capacitor of claim 14, wherein the capacitance formation portion of each cell is substantially quadrangular, and each electrode layer includes lead electrodes extending to the margin portion across two adjacent sides of the substantially quadrangular capacitance formation portion.

18. The capacitor of claim 17, further comprising:
conductive vias extending in the stacking direction from each of the lead electrodes extending across the two adjacent sides of the capacitance formation portion;
a first metal interconnection layer extending over and electrically interconnecting the conductive vias extending from lead electrodes of electrode layers of the first polarity; and a second metal interconnection layer extending over and electrically interconnecting the conductive vias extending from lead electrodes of electrode layers of the second polarity.

19. The capacitor of claim 14, the lead electrodes of each cell do not overlap with each other in the stacking direction.

* * * * *